United States Patent
Tomasini et al.

Patent Number: 5,748,029
Date of Patent: May 5, 1998

[54] MOS TRANSISTOR SWITCHING CIRCUIT WITHOUT BODY EFFECT

[75] Inventors: Luciano Tomasini, Monza; Rinaldo Castello, Arcore; Giancarlo Clerici, Vimodrone; Ivan Bietti, Casalromano, all of Italy

[73] Assignee: SGS-Thomson Microelectronics S.r.l., Agrate Brianza, Italy

[21] Appl. No.: 624,126

[22] Filed: Mar. 29, 1996

[30] Foreign Application Priority Data

Mar. 31, 1995 [EP] European Pat. Off. ............ 95830122

[51] Int. Cl.$^6$ ............................................. H03K 17/687
[52] U.S. Cl. .................... 327/389; 327/399; 327/434; 327/534
[58] Field of Search .................... 327/389, 399, 327/534, 434

[56] References Cited

U.S. PATENT DOCUMENTS 3,866,064  2/1975  Gregory et al. ............... 307/251
5,191,244  3/1993  Runaldue et al. ............. 307/475

FOREIGN PATENT DOCUMENTS

A-0 520 470  12/1992  European Pat. Off. ....... H03K 19/08
402196469  8/1990  Japan ........................... 327/534

OTHER PUBLICATIONS

Patent Abstracts of Japan, vol. 14, No. 51 (E-881) (3994) Jan. 30, 1990 & JP-A-01 276 920 Ricoh Co. Ltd, Nov. 7, 1989.

Patent Abstracts of Japan, vol. 12, No. 457 (E-688) Nov. 1988 & JP-A-63 182 907 Hitachi Ltd Jul. 28, 1988.

Primary Examiner—Margaret Rose Wambach
Attorney, Agent, or Firm—Wolf, Greenfield & Sacks, P.C.; James H. Morris

[57] ABSTRACT

A switching circuit utilizing MOS transistors without body effect having a first transistor inserted with source and drain terminals between two connection terminals, and a second and third transistors inserted in series by means of their respective source and drain terminals between the first transistor and a ground. The gate terminal of the second transistor is connected to the gate terminal of the first transistor to which is applied a command signal. Upon switching a signal is applied in phase opposition to the command signal to the gate terminal of the third transistor. The substrates of the first and the second transistors are connected to a connection node between the second and third transistors. The substrate of the third transistor is connected to ground.

17 Claims, 2 Drawing Sheets

1

MOS TRANSISTOR SWITCHING CIRCUIT WITHOUT BODY EFFECT

BACKGROUND OF THE INVENTION

1. Field of the Invention

The present invention relates to an integrated switching circuit and more specifically to a switching circuit for an electronic switch for low-voltage power supply circuits integrated with CMOS technology.

2. Discussion of the Related Art

Switching circuits are indispensable in various integrated circuit applications, for example, in circuits with switched capacitors for filters with reduced harmonic distortion. The electronic switches in the circuit are realized with MOS transistors which are piloted by means of distinct timing signals with phases not superimposed.

A rather simple type of electronic switch which is used commonly in the art is the so-called "pass-transistor" consisting of two complementary CMOS transistors which are connected in parallel together via their respective source and drain terminals. The transistors are piloted by signals in phase opposition upon switching. This switch displays no drawbacks in integrated circuits having sufficiently high supply voltages on the order of at least 5V. However, when supply voltage has lower values, typically around 3V, as is common for many integrated circuits, it is necessary to allow for that which in the technical literature is known as "body effect", where the term "body" represents the actual substrate of a transistor.

In any CMOS process of two mutually complementary transistors, one transistor is realized in its own substrate termed "a well" or pocket. For example, in a CMOS process defined as an N-well type, it is the p-channel transistor which is realized in an independent substrate termed "N-well" and conversely for the P-well type.

As is well known in the art, the actual threshold voltage at which the transistors of a CMOS integrated circuit conduct depends on the body effect. This means that the actual threshold voltage VTH of a transistor increases in absolute value when the voltage VSB between the source and body of the transistor is different from zero, i.e. when the transistor substrate is not short-circuited with its source region. Thus, VTH increases as VSB increases.

Generally, for correct operation of a "pass-transistor" the n-channel transistor substrate is kept at the lowest potential existing in the integrated circuit while the substrate of the p-channel transistor is kept at the highest potential.

If the supply voltage is too low for certain voltages at the two ends of the switch it might be impossible because of body effect to switch to conduction at least one of the two transistors making up the "pass-transistor". Thus, correct operation of the switch is prevented.

As explained in the article 'Higher Sampling Rates in SC Circuits by On-Chip Clock-Voltage Multiplication' by F. Krummenacher, H. Pinier and A. Guillaume—Laboratoire d'électronique général, EPFL, Lausanne, Switzerland, a solution to this problem is to pilot the switch transistors with voltage-boosted signals in phase opposition, the signals having a maximum voltage amplitude greater (usually double) than that of the supply voltage. This solution enures correct operation of the switch even with low supply voltage values. However, this solution involves the shortcoming that it requires a complicated circuit to generate the voltage-boosted piloting signals.

Another solution is to use so-called "natural" MOS transistors. As is known in the art, their ignition threshold is significantly lower than that of conventional MOS transistors. However, using natural MOS transistors involves additional operations of masking and diffusion of impurities as compared to a conventional integration process, with resulting cost increases.

In European patent application no. 94830387.0 of this same Applicant filed Jul. 29, 1994 there is described an electronic switch using MOS transistors without body effect and comprising mutually complementary transistors.

The technical problem the present invention overcomes is that of realizing an electronic switch with MOS transistors complementary or not, which while preserving circuit simplicity also avoids the shortcomings due to body effect without increasing manufacturing costs.

In view of the foregoing, it is an object of the present invention to provide an improved electronic switch utilizing MOS transistors.

SUMMARY OF THE INVENTION

In one illustrative embodiment of the invention a switching circuit is provided having first and second connection terminals. The switching circuit comprises a first transistor having first, second and command terminals and a substrate. The first and second terminals of the first transistor being connected to the first and second connection terminals of the switching circuit, a second transistor having first, second and command terminals and a substrate, the first terminals of the first and second transistors being connected, the command terminals of the first and second transistors being connected and the substrate of the first and second transistors being connected. The switching circuit also comprises a third transistor connected in series with the second transistor, the third transistor has first, second and command terminals and a substrate, the first terminal of the third transistor being connected to a second terminal of the second transistor, and the second terminal and substrate of the third transistor being connected to a reference potential.

In another illustrative embodiment of the invention an electronic switch is provided which comprises first and second switching circuits each having first and second connection terminals. The first switching circuit comprises a first transistor having first, second and command terminals and a substrate, the first and second terminals of the first transistor being connected to the first and second connection terminals of the first switching circuit, a second transistor having first, second and command terminals and a substrate, the first terminals of the first and second transistors being connected, the command terminals of the first and second transistors being connected and the substrates of the first and second transistors being connected, and a third transistor connected in series with the second transistor, having first, second and command terminals and a substrate, the first terminal of the third transistor being connected to the second terminal of the second transistor, and a second terminal and substrate of the third transistor being connected to a reference potential. The first and second connection terminals of the second switching circuit are respectively connected to the second and first connection terminals of the first circuit. The second switching circuit comprises a first transistor having first, second and command terminals and a substrate, the first and second terminals of the first transistor being connected to the first and second connection terminals of the second switching circuit, a second transistor having first, second and command terminals and a substrate, the first terminals of the first and second transistors being connected, the command terminals of the first and second transistors being connected and the substrates of the first and second transistors being connected. The second switching circuit also comprises a third transistor connected in series with the second transistor, having first, second and command terminals and a substrate, the first terminal, the third transistor being connected to the second terminal of the second transistor, and the second terminal and substrate of the third transistor being connected to the reference potential wherein the command terminals of the first and second transistors of the first switching circuit are connected to the command terminals of the first and second transistors of the second switching circuit.

In another illustrative embodiment of the invention a switching circuit is provided having first and second connection terminals. The switching circuit comprises a first transistor having first, second and command terminals and a substrate. The first and second terminals of the first transistor being connected to the first and second connection terminals of the switching circuit, and means for limiting a threshold voltage of the first transistor by coupling the substrate to a reference potential when the first transistor is off and coupling the substrate to the first terminal when the first transistor is on.

In a further illustrative embodiment of the invention, a method of limiting the threshold voltage of a switching transistor is provided. The method includes coupling a substrate of the switching transistor to a reference potential when a switching transistor is switched off, and coupling the substrate of the switching transistor to a terminal of the switching transistor when the switching transistor is switched on.

DETAILED DESCRIPTION

Figure 1:
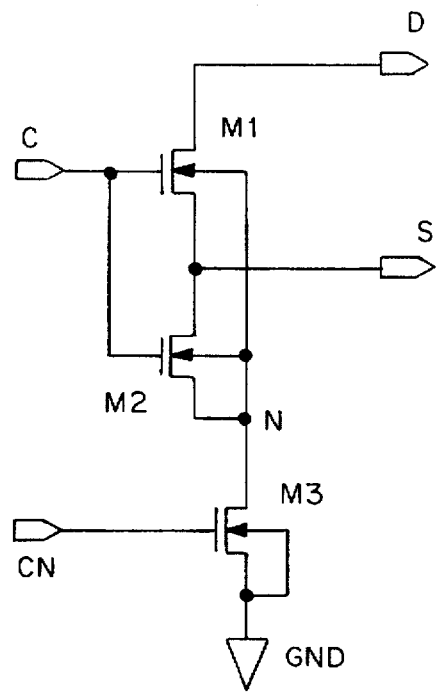
FIG. 1 shows a switching circuit in accordance with the present invention realized using n-channel MOS transistors.

FIG. 1 shows the diagram of a switching circuit in accordance with the present invention which permits realization of an electronic switch with MOS transistors without body effect for integrated circuits having low supply voltages.

Figure 2:
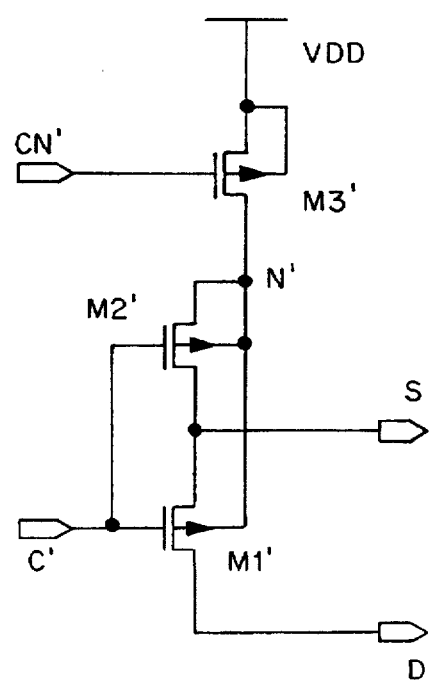
FIG. 2 is an equivalent circuit of FIG. 1, using p-channel MOS transistors.

In FIG. 1 n-channel transistors are used, while FIG. 2 is an equivalent circuit using p-channel transistors.

A first transistor M1 is inserted with its source and drain terminals between two connection terminals, S and D. At the gate terminal of M1 a switching command signal, C, is applied.

FIG. 1 also comprises second and third transistors M2 and M3 inserted in series with their respective source and drain terminals between the source terminal of the first transistor M1 and a reference potential, which for the diagram of FIG. 1 is a ground GND of the device which is inserted the electronic switch, and for FIG. 2 is power supply pole VDD of the device.

The gate terminal of the transistor M2 is connected to the gate terminal of the transistor M1, while at the gate terminal of the transistor M3 is applied a command signal CN in phase opposition to the command signal C. The substrates or "bulk" of the transistors M1 and M2 are both connected to a circuit node N which is connected to the drain terminals of the transistors M2 and M3. The substrate of the transistor M3 is connected to ground GND.

In FIG. 2, the substrates of the transistors M1' and M2' are both connected to a circuit node N' which in this case is a connection node between the source terminal of the transistor M2' and the drain terminal of the transistor M3'. The substrate of the transistor M3' is then connected to the power supply pole VDD.

The operating conditions distinguish between the source and drain terminals of the MOS transistors.

Considering the circuit diagram of FIG. 1 it can be seen that M1 is the actual switching element while M2 and M3 are auxiliary elements which permit connecting the bulk of the transistor M1 alternatively to ground GND or to the source of M1.

The signals C and CN are the voltages applied to the gate terminals of the transistors M1 and M3 and are logical commands, one the converse of the other. M1 does not conduct with its gate terminal at low-voltage, and neither does M2, thus M1 and M2 are "open". In this case, where C is low and CN is high, the gate voltage of the transistor M3 is high and M3 conducts, connecting the bulk of M1 to ground. Thus, the difference in potential between the bulk and ground is very small.

When the gate voltage of the transistor M1 is high, M1 conducts and so does transistor M2. In this case the bulk of the transistor M1 is connected to its own source and thus the difference in potential between the bulk and source is very small.

The body effect is nearly completely eliminated because the gate voltage of transistor M3 is low and M3 is open and does not permit any connection between the bulk of the transistor M3 and ground GND.

Operation of the switching circuit whose diagram is shown in FIG. 2 is equivalent to FIG. 1.

Figure 3:
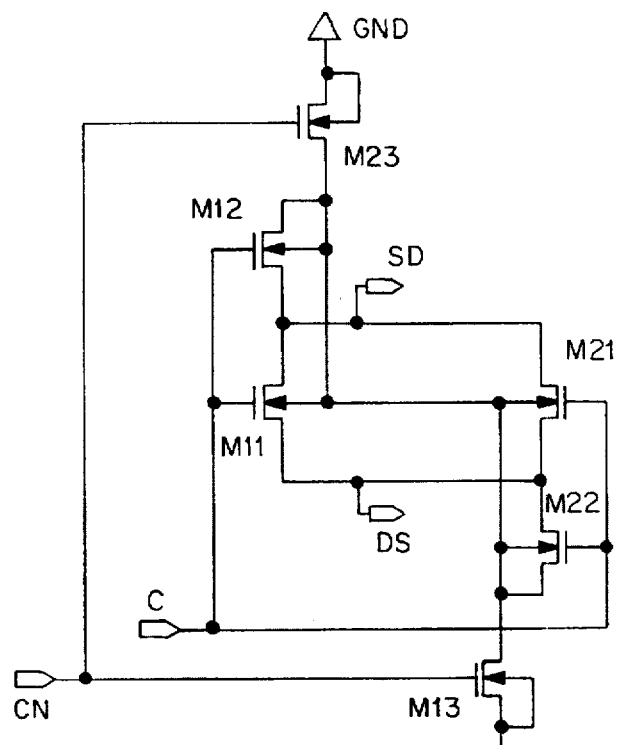
FIG. 3 is an electronic switch having symmetrically connected switching circuits.
Figure 4:
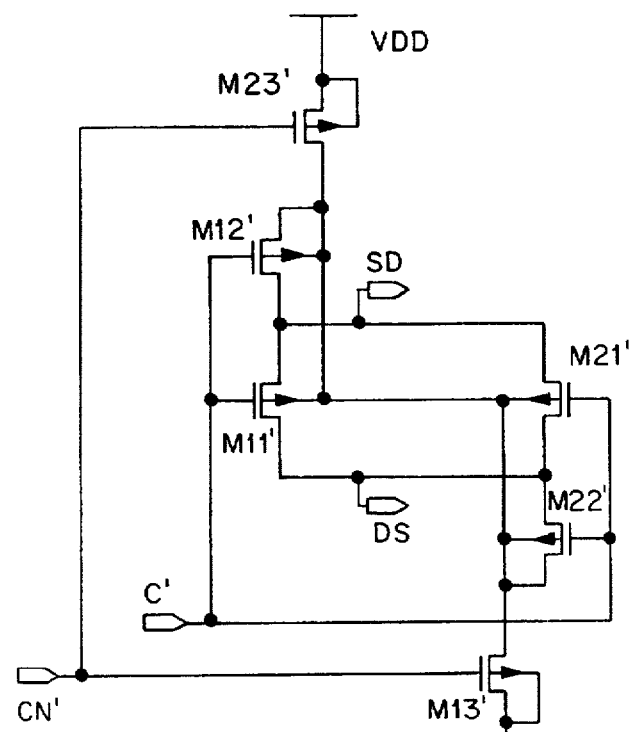
FIG. 4 is an equivalent circuit of FIG. 3, using p-channel MOS transistors.

In many cases, especially for differential circuit structures it is recommended to have symmetrical circuits even at the cost of greater integration area occupation. FIGS. 3 and 4 show how to realize electronic switches with n-channel or p-channel MOS transistors by inserting symmetrically between two connection terminals SD and DS a pair of switching circuits of the type indicated in FIG. 1 or FIG. 2.

In these two cases the transistors M11 and M21 and threshold transistors M11' and M21' are piloted by the command signal C. In an equivalent manner but with the signal CN in phase opposition to C are piloted the transistors M13 and M23 and the transistors M13' and M23'.

There can also be united in a complementary configuration a switching circuit in accordance with FIG. 1 and a switching circuit in accordance with FIG. 2 to realize a pass-transistor free of body effect. In this configuration the two main transistors must be piloted in mutual phase opposition as well as the auxiliary transistors.

All the circuits described can use in place of the conventional MOS transistors natural MOS transistors. This achieves a further reduction of the thresholds of the transistors.

Having thus described a least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only, and not intended to be limiting. The invention is limited only as defined in the following claims and the equivalents thereto.

What is claimed is:

1. A switching circuit having first and second connection terminals comprising:
   a first transistor having first, second and command terminals and a substrate, the first and second terminals of the first transistor being connected to the first and second connection terminals of the switching circuit;
   a second transistor having first, second and command terminals and a substrate, the first terminals of the first and second transistors being connected, the command terminals of the first and second transistors being connected and the substrates of the first and second transistors being connected; and
   a third transistor connected in series with the second transistor, having first, second and command terminals and a substrate, the first terminal of the third transistor being connected to the second terminal of the second transistor, and the second terminal and substrate of the third transistor being connected to a reference potential.

2. The switching circuit of claim 1 wherein the first, second and third transistors are n-channel MOS transistors and the reference potential is ground.

3. The switching circuit of claim 1 wherein the first, second and third transistors are p-channel MOS transistors and the reference potential is a potential of a power supply.

4. The switching circuit of claim 1 wherein the command terminals of the first and third transistors are responsive to command signals in mutual phase opposition.

5. The switching circuit of claim 1 wherein the first, second and third transistors are the natural MOS type transistors.

6. The switching circuit of claim 1 wherein the switching circuit further comprises a plurality of capacitors which are responsive to the switching circuit to form a switched filter that is integrated monolithically on a semiconductor substrate.

7. An electronic switch comprising:
   a first switching circuit having first and second connection terminals comprising:
      a first transistor having first, second and command terminals and a substrate, the first and second terminals of the first transistor being connected to the first and second connection terminals of the first switching circuit;
      a second transistor having first, second and command terminals and a substrate, the first terminals of the first and second transistors being connected, the command terminals of the first and second transistors being connected and the substrates of the first and second transistors being connected; and
      a third transistor connected in series with the second transistor, having first, second and command terminals and a substrate, the first terminal of the third transistor being connected to the second terminal of the second transistor, and the second terminal and substrate of the third transistor being connected to a reference potential; and
   a second switching circuit having first and second connection terminals respectively connected to the second and first connection terminals of the first switching circuit, the second switching circuit comprising:
      a first transistor having first, second and command terminals and a substrate, the first and second terminals of the first transistor being connected to the first and second connection terminals of the second switching circuit;
      a second transistor having first, second and command terminals and a substrate, the first terminals of the first and second transistors being connected, the command terminals of the first and second transistors being connected and the substrates of the first and second transistors being connected; and
      a third transistor connected in series with the second transistor, having first, second and command terminals and a substrate, the first terminal of the third transistor being connected to the second terminal of the second transistor, and the second terminal and substrate of the third transistor being connected to the reference potential, wherein the command terminals of the first and second transistors of the first switching circuit are connected to the command terminals of the first and second transistors of the second switching circuit.

8. The electronic switch of claim 7, wherein the electronic switch further comprises a plurality of capacitors responsive to the electronic switch to form a switched filter that is integrated monolithically on a substrate.

9. The electronic switch of claim 7, wherein the substrate of the first transistor of the first switching circuit is connected to the substrate of the second transistor of the second switching circuit.

10. The electronic switch of claim 7, wherein the first, second and third transistors of each switching circuit are n-channel MOS transistors and the reference potential of each switching circuit is ground.

11. The electronic switch of claim 7, wherein the first, second and third transistors of each switching circuit are p-channel MOS transistors and the reference potential of each switching circuit is a potential of a power supply.

12. The electronic switch of claim 7, wherein the command terminals of the third transistors of each switching circuit are connected to one another.

13. A switching circuit having first and second connection terminals comprising:
   a first transistor having first, second and command terminals and a substrate, the first and second terminals of the first transistor being connected to the first and second connection terminals of the switching circuit; and
   means for limiting a threshold voltage of the first transistor by coupling the substrate to a reference potential when the first transistor is off and coupling the substrate to the first terminal when the first transistor is on, wherein the means for limiting comprises second and third transistors, the second transistor having a source terminal coupled to the first terminal of the first transistor, a gate terminal coupled to the command terminal of the first transistor, and a drain terminal coupled to a drain terminal of the third transistor.

14. The switching circuit of claim 13, wherein the first transistor is a MOS transistor and the first terminal is a source terminal of the first transistor.

15. The switching circuit of claim 13, wherein the drain terminals of the second and third transistors are coupled to the substrate of the first transistor, and the first, second and third transistors are responsive to command signals such that the second transistor is on only when the first transistor is on and the third transistor is on only when the first transistor is off.

16. The switching circuit of claim 13 wherein the reference potential is ground and the first transistor is an n-channel MOS transistor.

17. The switching circuit of claim 13, wherein the first transistor is a p-channel MOS transistor, and the reference potential is a power supply pole.

* * * * *